(12) United States Patent
Muraki et al.

(10) Patent No.: US 8,258,541 B2
(45) Date of Patent: Sep. 4, 2012

(54) GALLIUM NITRIDE-BASED COMPOUND SEMICONDUCTOR LIGHT-EMITTING DEVICE

(75) Inventors: Noritaka Muraki, Ichihara (JP); Hironao Shinohara, Ichihara (JP)

(73) Assignee: Showa Denko K.K., Tokyo (JP)

( * ) Notice: Subject to any disclaimer, the term of this patent is extended or adjusted under 35 U.S.C. 154(b) by 1087 days.

(21) Appl. No.: 12/097,139

(22) PCT Filed: Dec. 13, 2006

(86) PCT No.: PCT/JP2006/325314
§ 371 (c)(1),
(2), (4) Date: Jun. 12, 2008

(87) PCT Pub. No.: WO2007/069774
PCT Pub. Date: Jun. 21, 2007

(65) Prior Publication Data
US 2009/0045434 A1    Feb. 19, 2009

(30) Foreign Application Priority Data

Dec. 13, 2005    (JP) .................................. 2005-358717

(51) Int. Cl.
*H01L 33/00* (2010.01)
(52) U.S. Cl. ....................................................... 257/103
(58) Field of Classification Search .................. 257/103, 257/98; 438/42
See application file for complete search history.

(56) References Cited

U.S. PATENT DOCUMENTS

| 6,870,191 | B2 | 3/2005 | Niki et al. | |
| 6,924,163 | B2 * | 8/2005 | Okazaki et al. | 438/46 |
| 2002/0050561 | A1 | 5/2002 | Heremans et al. | |
| 2002/0190263 | A1 * | 12/2002 | Hata et al. | 257/103 |
| 2002/0195609 | A1 | 12/2002 | Yoshitake et al. | |
| 2003/0057444 | A1 | 3/2003 | Niki et al. | |
| 2003/0178626 | A1 * | 9/2003 | Sugiyama et al. | 257/79 |
| 2003/0180977 | A1 | 9/2003 | Suzuki et al. | |

(Continued)

FOREIGN PATENT DOCUMENTS

CN    1433088 A    7/2003

(Continued)

OTHER PUBLICATIONS

I Hung-Wen Huang, et al., "Improvement of InGaN-GaN Light-Emitting Diode Performance With a Nano-Roughened ] p-GaN Surface", IEEE Photonics Technology Letters, May 2005, pp. 983-985, vol. 17, No. 5 /.*

(Continued)

*Primary Examiner* — Marcos D. Pizarro
*Assistant Examiner* — Sarah Salerno
(74) *Attorney, Agent, or Firm* — Sughrue Mion, PLLC

(57) ABSTRACT

A gallium nitride-based compound semiconductor light-emitting device including a positive electrode having openings, which is excellent in light extraction efficiency. The gallium nitride-based compound semiconductor light-emitting device includes a substrate; an n-type semiconductor layer, a light-emitting layer, and a p-type semiconductor layer, the layers being formed of a gallium nitride-based compound semiconductor and being stacked in this order on the substrate; a positive electrode which is provided so as to contact the p-type semiconductor layer; and a negative electrode which is provided so as to contact the n-type semiconductor layer, where the positive electrode is a positive electrode having openings, and at least a portion of the surface of the p-type semiconductor layer corresponding to the openings are roughened surface derived from spherical particulates.

17 Claims, 6 Drawing Sheets

U.S. PATENT DOCUMENTS

| | | |
|---|---|---|
| 2004/0266043 A1 | 12/2004 | Oohata et al. |
| 2005/0001222 A1 | 1/2005 | Kurahashi et al. |
| 2007/0096126 A1 | 5/2007 | Kamei |
| 2009/0267103 A1* | 10/2009 | Muraki et al. .................. 257/99 |

FOREIGN PATENT DOCUMENTS

| | | |
|---|---|---|
| CN | 1529915 A | 9/2004 |
| CN | 1652367 A | 8/2005 |
| JP | 08032108 | 2/1996 |
| JP | 8-102548 A | 4/1996 |
| JP | 2000-106454 A | 4/2000 |
| JP | 2001-68727 A | 3/2001 |
| JP | 2002016282 | 1/2002 |
| JP | 2003-174191 A | 6/2003 |
| JP | 2003-318441 A | 11/2003 |
| JP | 2003347586 | 12/2003 |
| JP | 2004-31856 A | 1/2004 |
| JP | 2004-179491 A | 6/2004 |
| JP | 200564113 A | 3/2005 |
| JP | 2005-303286 A | 10/2005 |
| KR | 10-2005-0092947 | 9/2005 |
| TW | I228323 B | 2/2005 |
| TW | I231077 B | 4/2005 |
| TW | I241729 B | 10/2005 |
| TW | I245439 B | 12/2005 |
| WO | 2005088741 | 9/2005 |
| WO | 2005091389 A1 | 9/2005 |

OTHER PUBLICATIONS

Japanese Office Action dated Dec. 15, 2011, for Japanese Application No. 2005-358717.

* cited by examiner

GALLIUM NITRIDE-BASED COMPOUND SEMICONDUCTOR LIGHT-EMITTING DEVICE

TECHNICAL FIELD

The present invention relates to a gallium nitride-based compound semiconductor light-emitting device, and in particular, to a gallium nitride-based compound semiconductor light-emitting device excellent in emission output and a manufacturing method thereof.

BACKGROUND ART

In recent years, GaN compound semiconductor materials have been attracting attention as semiconductor materials for short-wavelength light-emitting devices. GaN compound semiconductor materials are formed on substrates such as various oxide substrates and III-V compounds, including a sapphire single crystal, by a metal-organic chemical vapor deposition (MOCVD) method, a molecular beam epitaxy method (MBE method), and the like.

Incidentally, external quantum efficiency of a light-emitting device is represented as a value in which its light extraction efficiency and internal quantum efficiency are multiplied. The term "internal quantum efficiency" is a percentage of energy to be converted into light in the energy of electric current injected into the device. The term "light extraction efficiency" is a percentage of light which can be extracted to the outside in the light generated inside a semiconductor crystal.

It has been said that the internal quantum efficiencies of light-emitting devices have been improved to approximately 70 to 80% due to an improvement in crystal conditions and a study for the structures, and sufficient effects on the amount of injected current have been obtained.

However, light extraction efficiencies with respect to injected current are low in general in not only the GaN compound semiconductor materials, but also light-emitting diodes (LEDs), it is difficult to say that internal light emission with respect to injected current is sufficiently extracted to the outside.

The reason that light extraction efficiencies are low is that light emitted from light-emitting layers are repeatedly reflected and absorbed depending on crystal materials in the LED structures, and the probability that the light cannot be extracted to the outside is high in reflection at a critical angle or more due to Snell's law.

In order to improve light extraction efficiency, technology in which light extraction efficiency is improved such that a light extracting surface is roughened, and various angles are provided to the light extracting surface, which improves the light extraction efficiency has been proposed (refer to, for example, Japanese Unexamined Patent Publication (Kokai) No. 2003-218383 and Japanese Unexamined Patent Publication (Kokai) No. 2005-64113).

However, by the roughening of the surface manufactured by the proposed technology, the roughened pattern is formed from plane surfaces or into a pyramid structure, and the roughened area is not entirely impregnated with a resin material depending on its viscosity when the device is formed as an LED package, a light extraction effect due to the roughening or a light extraction effect according to a resin refractive index to be expected is not sufficiently obtained, which leads to the problem that the process is made cumbersome and complicated because it is necessary to change a pressure after resin infusion in order to make the resin thoroughly adhered to the roughened surface.

Further, with respect to a method for performing roughening, because a method for roughened mask patterning or the like is required, it is necessary to follow a cumbersome procedure in the process, which is the problem in manufacturing.

On the other hand, as a characteristic of GaN compound semiconductor materials, lateral current diffusion is little. Therefore, an electric current is injected into only a semiconductor immediately beneath an electrode, and light emitted from a light-emitting layer is blocked by the electrode, and is not extracted to the outside. Usually, in this type of light-emitting device, a transparent electrode is used as a positive electrode, and light is extracted through the transparent electrode.

A conventional transparent electrode has a layered structure in which oxide such as Ni or Co, and Au or the like serving as contact metal are combined. In recent years, a layered structure whose transparency is improved by making a film thickness of contact metal as thin as possible by using oxide such as ITO having higher conductivity is employed as a positive electrode, and light from a light-emitting layer is efficiently extracted to the outside.

Further, there has been proposed a structure in which a pattern of a positive electrode is made into a pattern having openings, for example, a lattice pattern, and emission of light is extracted from the openings (refer to, for example, Japanese Unexamined Patent Publication (Kokai) No. 2004-179491). However, in this method, portions from which emission of light is extracted are limited to the portions around the positive electrode, and emission of light is not extracted from the central portions of the openings, and in the present circumstances, satisfactory light extraction efficiencies have not been increased.

DISCLOSURE OF THE INVENTION

An object of the present invention is to solve the problems in the prior art described above, and to provide a gallium nitride-based compound semiconductor light-emitting device including a positive electrode having openings, which is excellent in its light extraction efficiency, and a manufacturing method thereof.

The present invention provides the following inventions.

(1) A gallium nitride-based compound semiconductor light-emitting device comprising a substrate; an n-type semiconductor layer, a light-emitting layer, and a p-type semiconductor layer, the layers being formed of a gallium nitride-based compound semiconductor and being stacked in this order on the substrate; a positive electrode which is provided so as to contact the p-type semiconductor layer; and a negative electrode which is provided so as to contact the n-type semiconductor layer, wherein the positive electrode is a positive electrode having openings, and at least a portion of the surface of the p-type semiconductor layer corresponding to the openings are roughened surface derived from spherical particulates.

(2) A gallium nitride-based compound semiconductor light-emitting device comprising a substrate; an n-type semiconductor layer, a light-emitting layers and a p-type semiconductor layer, the layers being formed of a gallium nitride-based compound semiconductor and being stacked in this order on the substrate; a positive electrode which is provided so as to contact the p-type semiconductor layer; and a negative electrode which is provided so as to contact the n-type semiconductor layer, wherein the positive electrode is a positive electrode having openings, and at least a portion of the surface of the p-type semiconductor layer corresponding to the openings are roughened surfaces whose apical portions are semispherical.

(3) A gallium nitride-based compound semiconductor light-emitting device comprising a substrate; an n-type semiconductor layer, a light-emitting layer, and a p-type semiconductor layer, the layers being formed of a gallium nitride-based compound semiconductor and being stacked in this order on the substrate; a positive electrode which is provided so as to contact the p-type semiconductor layer; and a negative electrode which is provided so as to contact the n-type semiconductor layer, wherein the positive electrode is a positive electrode having openings, and at least a portion of the surface of the p-type semiconductor layer corresponding to the openings are roughened surfaces whose apical portions are formed from curved surfaces.

(4) The gallium nitride-based compound semiconductor light-emitting device according to any one of (1) to (3) above, wherein the positive electrode having the openings is in a lattice pattern or a comb-like pattern.

(5) The gallium nitride-based compound semiconductor light-emitting device according to (4) above, wherein widths of bars of the lattice pattern or teeth of the comb-like pattern are from 1 µm to 50 µm.

(6) The gallium nitride-based compound semiconductor light-emitting device according to (4) or (5) above, wherein a distance between bars of the lattice pattern or teeth of the comb-like pattern is from 1 µm to 50 µm.

(7) The gallium nitride-based compound semiconductor light-emitting device according to any one of (1) to (6) above, wherein diameters of protruding portions (particulates) of the roughened surface are from 0.01 to 3 µm.

(8) The gallium nitride-based compound semiconductor light-emitting device according to any one of (1) to (7) above, wherein heights of upper ends of the roughened surface are from 0.1 to 2 µm from a surface at which the negative electrode is formed.

(9) The gallium nitride-based compound semiconductor light-emitting device according to (8) above, wherein the heights of upper ends of the roughened surface are the same height as the surface of the p-type semiconductor layer.

(10) The gallium nitride-based compound semiconductor light-emitting device according to any one of (1) to (9) above, wherein heights of the protruding portions of the roughened surface are from 0.01 to 1 µm.

(11) The gallium nitride-based compound semiconductor light-emitting device according to any one of (1) to (10) above, wherein a density of the protruding portions (particulates) of the roughened surface is from $1 \times 10^5$ pieces/mm$^2$ to $1 \times 10^8$ pieces/mm$^2$.

(12) The gallium nitride-based compound semiconductor light-emitting device according to any one of (1) to (11) above, wherein the roughened surface also exists at four sides of the light-emitting device.

(13) The gallium nitride-based compound semiconductor light-emitting device according to any one of (1) to (12) above, wherein the roughened surface also exists between the positive electrode and the negative electrode.

(14) A method for manufacturing a gallium nitride-based compound semiconductor light-emitting device, comprising the following steps (1) to (4) of:
(1) stacking an n-type semiconductor layer, a light-emitting layer, and a p-type semiconductor layer which are formed of a gallium nitride-based compound semiconductor, in this order on a substrate;
(2) forming a positive electrode having openings on the p-type semiconductor layer;
(3) forming a mask formed of metal microparticles on the p-type semiconductor layer corresponding to the openings; and
(4) performing dry etching onto the gallium nitride-based compound semiconductor from above the mask.

(15) The method according to (14) above, wherein the step (3) comprises the step of forming a metal thin film on the p-type semiconductor layer and the step of a thermal treatment thereafter.

(16) The method according to (14) or (15) above, wherein the metal microparticles are made of metal selected from the group consisting of Ni, Au, Sn, and Ge, or a low melting point alloy containing at least one kind of these metals.

(17) A gallium nitride-based compound semiconductor light-emitting device manufactured by the method according to any one of (14) to (16) above.

(18) A lamp comprising the gallium nitride-based compound semiconductor light-emitting device according to any one of (1) to (13) and (17) above.

(19) An electronic equipment incorporating the lamp according to (18) above.

(20) A mechanical device incorporating the electronic equipment according to (19) above.

In accordance with the present invention having the feature that specific pattern roughening is performed onto a surface of a p-type semiconductor layer corresponding to the openings in a gallium nitride-based compound semiconductor light-emitting device including a positive electrode having openings, emission of light is extracted from the entire openings, which provides the gallium nitride-based compound semiconductor light-emitting device having satisfactory light extraction efficiency. Moreover, poor resin impregnation is decreased when a light-emitting device is processed into a lamp, and it is possible to form a lamp having high light-condensing according to a resin refractive index.

Further, in a roughening method in the present invention, an advanced mask patterning process or the like is not required, which makes it possible to form a roughened region simply and inexpensively. Moreover, with respect to roughening using a mask formed of low melting-metal microparticles, it is possible to arbitrarily vary a roughened pattern by adjusting a metal film thickness and a thermal treatment temperature, and it is possible to form an optimum light extraction pattern according to a emission light wavelength (which is 350 nm to 600 nm in a case of the gallium nitride-based compound semiconductor light-emitting device of the present invention).

BEST MODE FOR CARRYING OUT THE INVENTION

The light-emitting efficiency of a light-emitting device is represented as a value in which its light extraction efficiency and internal quantum efficiency are multiplied. The term "internal quantum efficiency" is a percentage of energy to be converted into light in the energy of electric current injected into the device. The term "light extraction efficiency" is a percentage of light which can be extracted to the outside in the light generated inside a semiconductor crystal.

The present invention is a gallium nitride-based compound semiconductor light-emitting device including a positive electrode having openings on a p-type semiconductor layer, in which its light extraction efficiency is improved by applying specific patterned roughening onto a surface of the p-type semiconductor layer corresponding to the openings.

Figure 1:
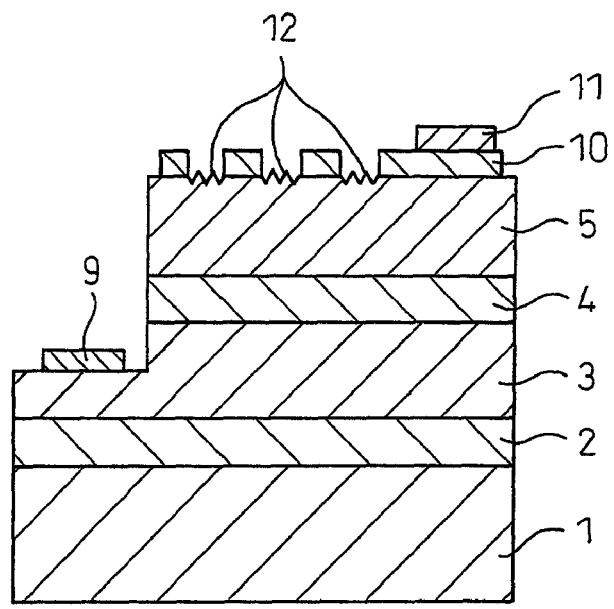
FIG. 1 is a diagram schematically showing a cross section as an example of a gallium nitride-based compound semiconductor light-emitting device of the present invention.

FIG. 1 is a diagram schematically showing a cross section of a gallium nitride-based compound semiconductor light-emitting device of the present invention. In the drawing, numerical reference 1 denotes a substrate, numerical reference 2 denotes a buffer layer, numerical reference 3 denotes an n-type semiconductor layer, numerical reference 4 denotes a light-emitting layer, and numerical reference 5 denotes a p-type semiconductor layer. A portion of the light-emitting layer 4 and a portion of the p-type semiconductor layer 5 are eliminated by etching so as to expose a portion of the n-type semiconductor layer, and a positive electrode 10 and a negative electrode 9 are formed respectively on the remaining p-type semiconductor layer 5 and the exposed n-type semiconductor layer 3. Reference numeral 11 denotes a bonding pad. The positive electrode 10 has openings 12, and the portions of the p-type semiconductor layer corresponding to the openings 12 are roughened regions that specific patterned roughening is applied onto its surface.

Figure 2:
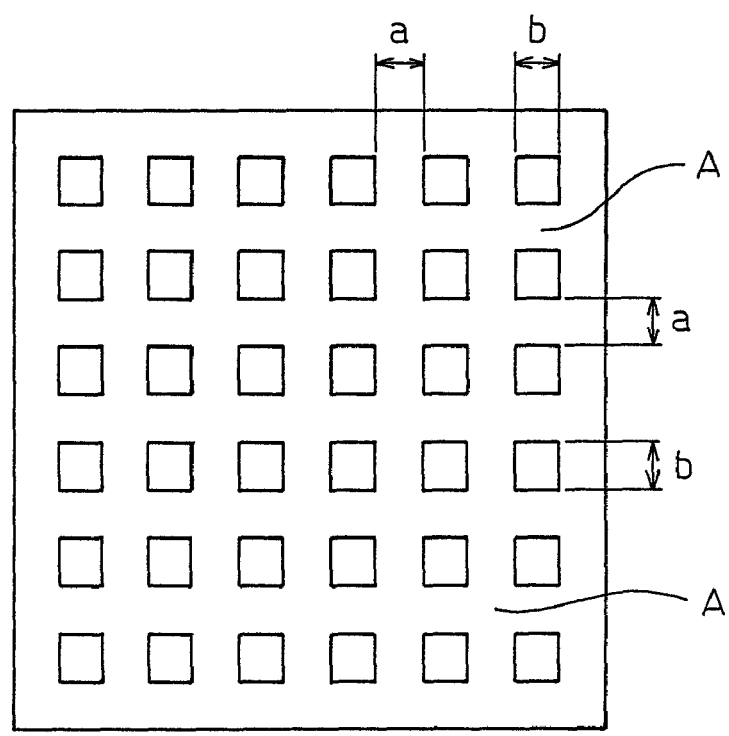
FIG. 2 is a diagram showing an example of a positive electrode having openings.
Figure 3:
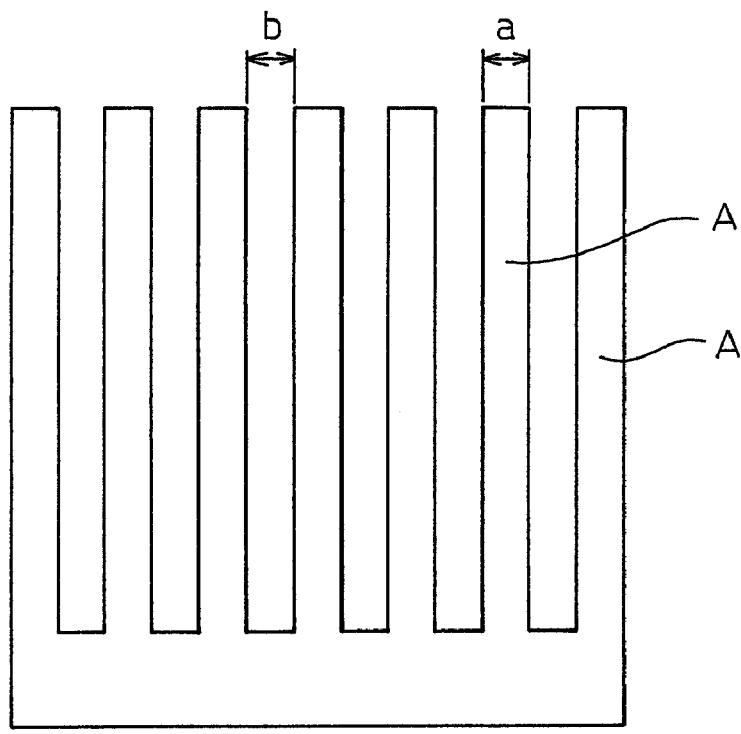
FIG. 3 is a diagram showing another example of a positive electrode having openings.
Figure 4:
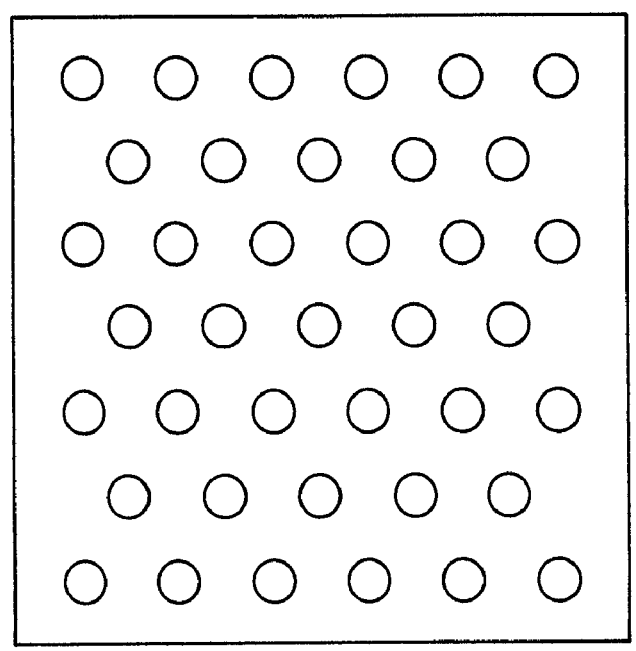
FIG. 4 is a diagram showing yet another example of a positive electrode having openings.

In the present invention, the positive electrode has the openings. There is no restriction on the shape of the positive electrode except for the point that the positive electrode must have openings. However, shapes such as a lattice pattern as shown in FIG. 2, a comb-like pattern as shown in FIG. 3, and a pattern in which circular holes are opened in a zigzag pattern as shown in FIG. 4 may be exemplified.

In cases of lattice pattern and comb-like pattern, the widths (a in FIG. 2 and FIG. 3) of the bars of the lattice and the teeth of the comb (A in FIG. 2 and FIG. 3) are preferably from 1 to 50 μm, and more preferably from 2 to 30 μm, and still more preferably from 3 to 15 μm. In a case of a width less than 1 μm, the lateral-spreading of electric current in the positive electrode is deteriorated, and it is not preferable from the standpoint of an amount of light extraction, and a width greater than 50 μm is not preferable because an area for light extraction is decreased. The distances (b in FIG. 2 and FIG. 3) between the bars of the lattice or the teeth of the comb are preferably from 1 to 50 μm, more preferably from 2 to 30 μm, and still more preferably 3 to 20 μm. A distance less than 1 μm is not preferable because an area for light extraction is decreased, and a distance greater than 50 μm is not preferable because emission of light from the centers of the openings is decreased. Further, the widths of the bars of the lattice and the teeth of the comb are preferably approximately 1.1 to 1.3 times of the distances among the bars of the lattice and the teeth of the comb.

As a material for the positive electrode, metal such as Au, Ni, Co, Cu, Pd, Pt, Rh, Os, Ir, and Ru, or the like may be used. Further, a transparent conductive metal oxide such as ITO, NiO, and CoO, or the like may be used. As a mode of using a transparent conductive metal oxide, the transparent conductive metal oxide may be contained in the form of aggregates in the above-described metal film, or may be formed so as to be stacked on the above-described metal film into a layer. It goes without saying that a transparent conductive metal oxide may be used singularly. Among those, ITO has excellent transparency and high conductivity, which is preferable.

A thickness of the positive electrode differs depending on a material to be used. However, generally, a thickness of the positive electrode is preferably from 10 to 1000 nm. For example, in a case of ITO, a thickness thereof is preferably from 100 to 800 nm, that is a thickness through which allows an emission light wavelength to be transmissive satisfactorily, and is more preferably from 200 to 500 nm.

The deposition of the positive electrode may be carried out by a means in common use such as a vacuum evaporation method or a sputtering technique, which are well-known in this technological field. In order to perform deposition in a pattern having openings, a photolithography technology and a liftoff technique which are well-known in this technological field may be used. In some cases, thermal annealing aimed at alloying or transparency is performed to the positive electrode after a positive electrode is formed. However, thermal annealing may be not performed thereto.

A bonding pad to which a wire to apply electric current is connected is provided to the positive electrode. As the bonding pad, various structures using materials such as Au, Al, Ni, Ti, and Cu are widely known, and these widely known materials and structures may be used as a bonding pad without any restriction.

Further, a thickness thereof is preferably from 100 to 1000 nm. Because the thicker the thickness is, the higher the bondability is from the standpoint of characteristic of a bonding pad, a thickness thereof is preferably 300 nm or more. Moreover, a thickness thereof is preferably 500 nm or less from the standpoint of cost of manufacturing.

With respect to the surface of the roughened regions of the p-type semiconductor layer corresponding to the openings 12 of the positive electrode, the heights of the upper ends have a height which is substantially the same as the surface of the p-type semiconductor layer, and the surface is formed into protruding curve shapes different in size. Further, provided that the surface of the roughened portion is formed into an independent spherical lens shape, it is possible to further improve the light extraction efficiency.

Figure 5:
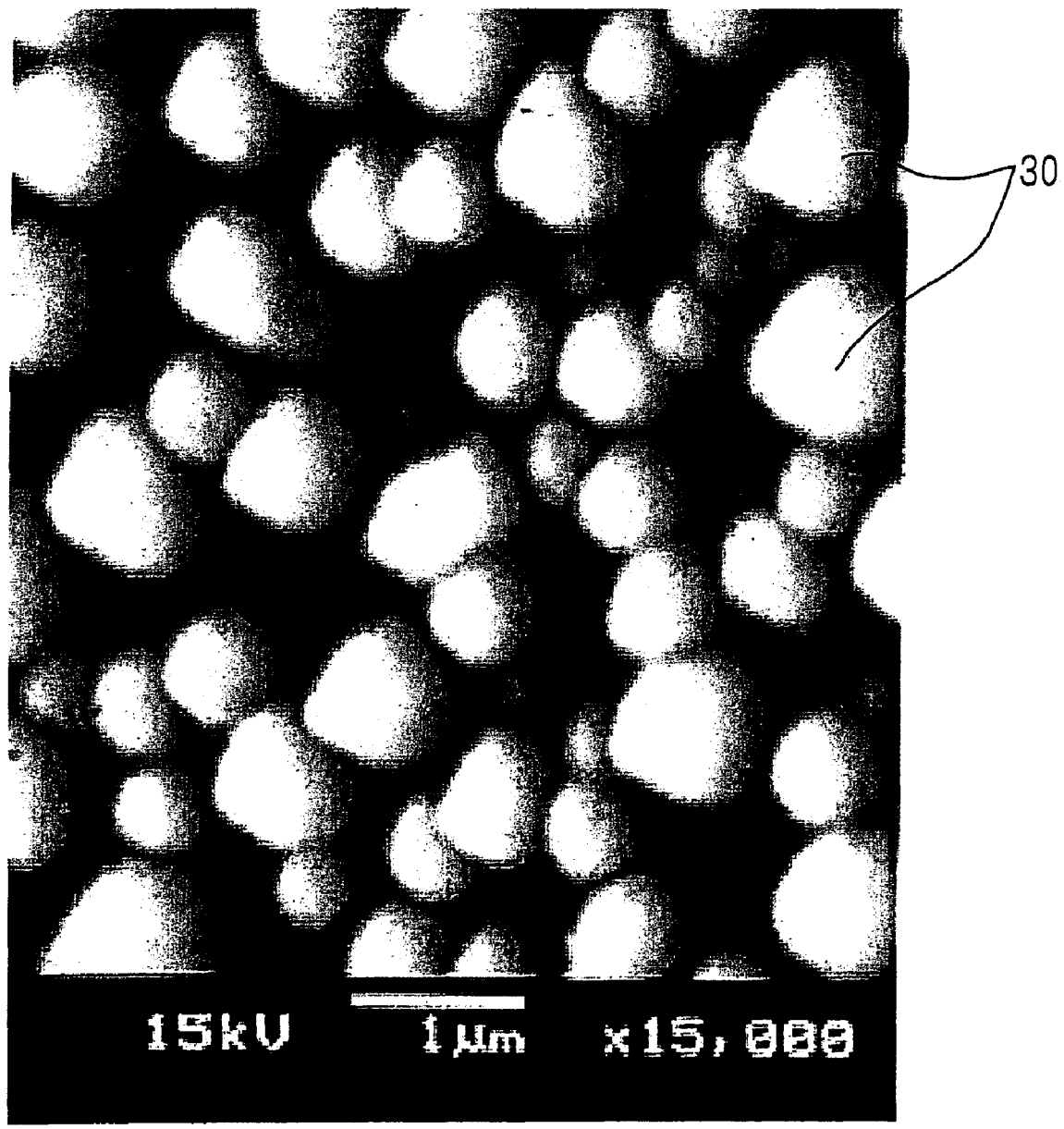
FIG. 5 is a SEM photograph (at a magnification of 15,000 times) of a surface of a roughened region of the gallium nitride-based compound semiconductor light-emitting device of the present invention manufactured in an example 1.

FIG. 5 is a SEM photograph (at a magnification of 15,000 times) of a surface of the roughened region. As is clear from the drawing, the unevenness of the roughened region derive from spherical particulates (shown by numerical reference 30 in FIG. 5). In the present invention, the term "spherical" means not only a regular sphere, but also an elliptical sphere. Namely, the term "spherical" means that the outer surfaces of the particulates are composed of curved surfaces which do not substantially include plane surfaces. The inventors of the present invention have found that the light extraction efficiency is improved by providing unevenness of in such a pattern onto the exposed portions of the p-type impurity semiconductor facing the openings of the positive electrode.

The diameters of the respective particulates preferably range from 0.01 to 3 μm. Within this range, the light extraction efficiency is effectively improved.

Those preferably range from 0.1 to 1 μm. A density of the particulates is preferably within a range from $1 \times 10^5$ pieces/mm$^2$ to $1 \times 10^8$ pieces/mm$^2$. Within this range, the light extraction efficiency is effectively improved. It is preferably within a range from $1 \times 10^6$ pieces/mm$^2$ to $1 \times 10^7$ pieces/mm$^2$.

Figure 6:
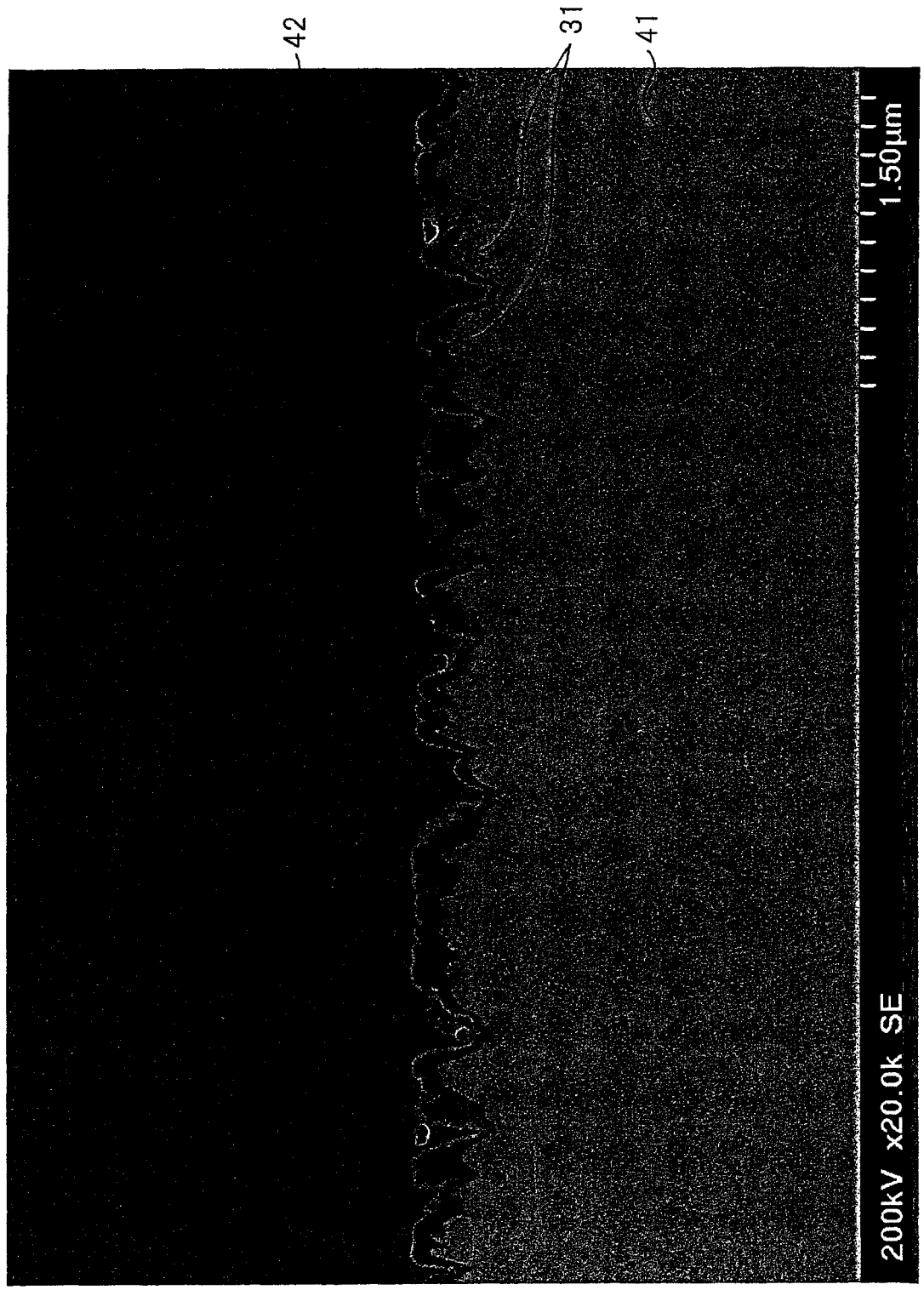
FIG. 6 is a SEM photograph (at a magnification of 20,000 times) of a cross section of the roughened region of the gallium nitride-based compound semiconductor light-emitting device of the present invention manufactured in Example 1.

Further, FIG. 6 is a SEM photograph (at a magnification of 20,000 times) of a cross section of the roughened region after resin-packaging. Reference numeral 41 in FIG. 6 denotes a p-type impurity semiconductor portion, and numerical reference 42 denotes a resin portion. When the roughened region is viewed on the SEM photograph of the cross section, the halves of the above-described particulates are buried in the p-type semiconductor layer, and the apical portions thereof are formed as semi-spherical protruding portions. The term "semi-spherical" here means, as described above, not only a regular sphere, but also an elliptical sphere. Namely, the term "semi-spherical" means that the protruding portions of the roughened surface are composed of curved surfaces which do not substantially include plane surfaces.

The diameters of the maximum portions of the respective protruding portions of the roughened region (shown by numerical reference 31 in FIG. 6) observed on the SEM photograph of the cross section preferably range from 0.01 to 3 μm. Within this ranger the light extraction efficiency is effectively improved. Those preferably range from 0.1 to 1 μm. Further, the heights of the protruding portions preferably range from 0.01 to 3 μm. Within this range, the light extraction efficiency is effectively improved. Those preferably range from 0.1 to 1 μm. A density of the protruding portions is preferably within a range from $1 \times 10^5$ pieces/mm$^2$ to $1 \times 10^8$ pieces/mm$^2$. Within this range, the light extraction efficiency is effectively improved. It is preferably within a range from $1 \times 10^6$ pieces/mm$^2$ to $1 \times 10^7$ pieces/mm$^2$.

The heights of the upper ends of the formed roughened surface from the surface on which the negative electrode is formed preferably range from 0.1 to 2.0 μm, which is preferably substantially the same height as the surface of the p-type semiconductor layer.

Further, provided that the roughened region is formed so as to have the above-described specific patterned roughened surface at the four sides of the light-emitting device, and between the negative electrode and the positive electrode, emission of light is effectively extracted from the four sides of the light-emitting device, and the space between the negative electrode and the positive electrode, and the light extraction efficiency is further improved.

Figure 7:
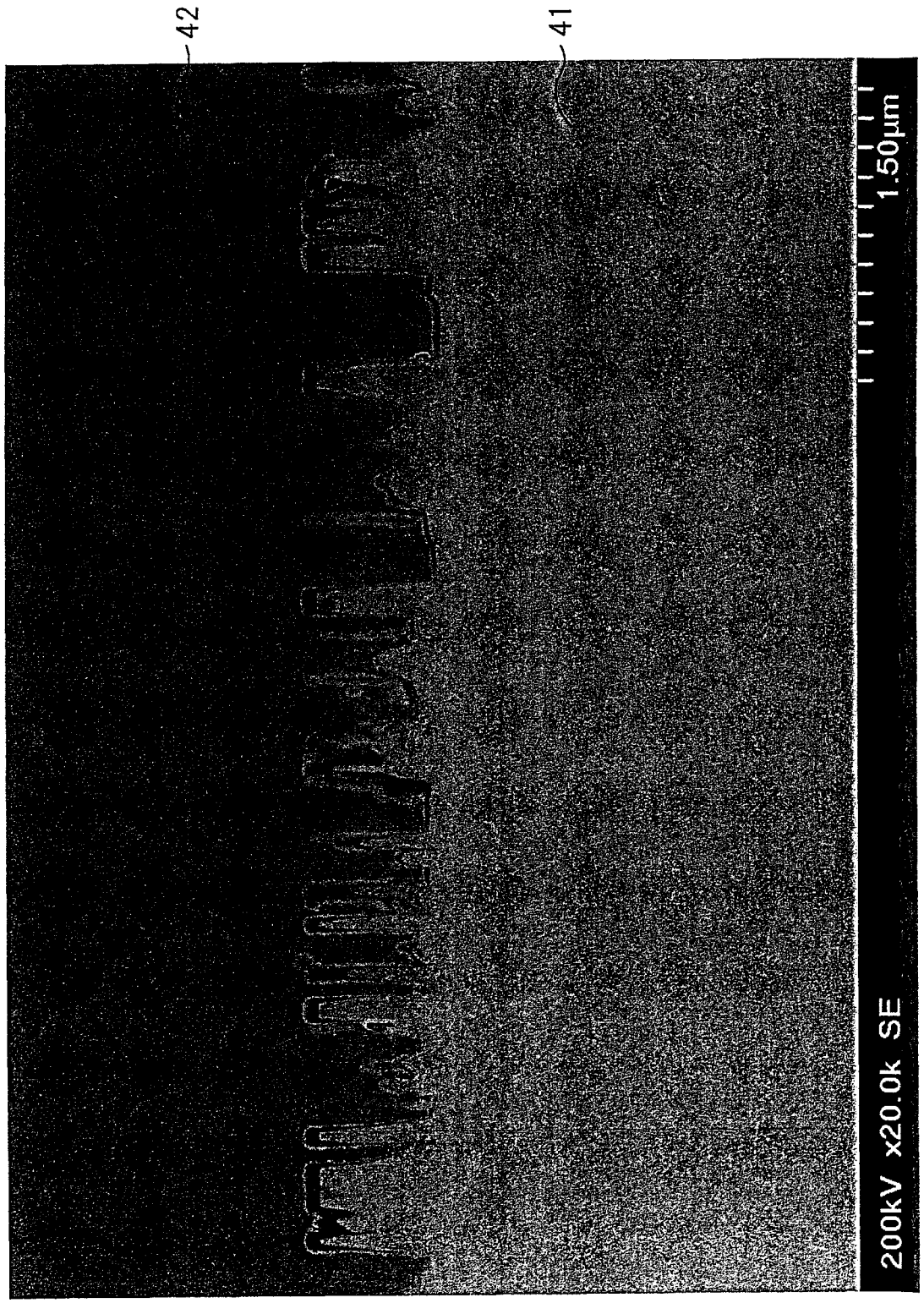
FIG. 7 is a SEM photograph of a cross section of the light-emitting device four-side portions of a conventional gallium nitride-based compound semiconductor light-emitting device.

FIG. 7 is a TEM photograph of a cross section of the light-emitting device four-side portion of a conventional gallium nitride-based compound light-emitting device. The light-emitting device four-side portion is roughened. However, most of the outer surfaces of the protruding portions are composed of plane surfaces, which are completely different in shape and size from the roughening in the present invention.

Next, a method for forming a roughened region having the above-described specific patterned roughened surface will be described.

In the present invention, the formation of a roughened region may be carried out such that a mask formed of metal microparticles is formed on the surface of the p-type semiconductor layer corresponding to the region, and dry etching is performed onto the p-type semiconductor layer from above the mask. With respect to a selection of metal, a metal having cohesive property at low temperature, from which spherical microparticles can be obtained is preferable. As such metal, a metal selected from the group consisting of, for example, Ni, Au, Sn, and Ge, or a low melting point alloy containing at least one kind of these metals may be exemplified. Among these, an AuSn alloy, an AuGe alloy, an AuSnNi alloy, and an AuGeNi alloy are preferable. It is most preferable to use an AuSn alloy thereamong. It has been known that an AuSn alloy whose composition ratio of Sn is approximately 10% to 35% is made into an eutectic alloy at approximately 190 to 420° C., and it has been known that an alloy layer generally has an aggregate form at a temperature over 420° C.

In order to prepare a mask formed of metal microparticles, first, a metal thin film is formed by a generally-known vacuum evaporation system. A thickness of the metal thin film is preferably greater than or equal to 50 Å and less than or equal to 1000 Å. Further, if it is possible to control the thickness of the metal thin film uniformly within the above-described range, there is no problem to use a sputtering system.

In order to obtain a mask formed of metal microparticles, thermal treatment for one minute or more is applied to the formed metal thin film at temperatures within a range, which differs depending on the metal to be used, but is generally from 250 to 600° C., in an oxygenic atmosphere or anoxic atmosphere.

The metal after thermal treatment is greatly different in shape depending on whether the thermal treatment is carried out in the oxygenic atmosphere or the anoxic atmosphere, and thermal treatment in the anoxic atmosphere is more preferable in order to obtain high emission output. It is possible to adjust microparticles in shape after the treatment depending on a thermal treatment temperature, which makes it possible to control metal microparticles so as to be made in appropriate shape and density in accordance with a wavelength of light to be extracted.

Because the shapes of the spherical particulates after the process onto the roughened region are formed into the substantially same shapes as the pattern of the metal microparticle mask, it is possible to control the spherical particulates in shape after the process by controlling the metal microparticle mask in shape. Accordingly, the shapes of the metal microparticles forming the mask are preferably spheres with diameters of 0.01 to 3 μm, and more preferably 0.1 to 1 μm.

After forming the metal microparticle mask, dry etching is performed onto the p-type semiconductor layer formed of the gallium nitride-based compound semiconductor from above the mask, which makes it possible to form the above-described specific patterned roughened surface. With respect to dry etching, by using a general reactive ion etching (RIE) type dry etching, the etching is performed in the gas containing chlorine. In order to prevent a change in a metal aggregate form (metal microparticle shapes) due to heat, it is preferable to keep a substrate temperature of 100° C. or lower.

The above-described method is different from a conventional method using the resistance property of metal to dry etching, and has a feature that a micro-loading effect which is caused by densification of the metal microparticle mask, and is a general minus effect in dry etching is utilized. Because it is possible to form spherical-roughened pattern using low melting metal which is easy to control in shape without using metal having high hardness and high melting point in this method, the method is extremely useful in consideration of the productivity.

The metal microparticle mask is gradually etched by dry etching, and at the same time when the p-type semiconductor layer is etched into a desired roughened pattern, the metal microparticle mask disappears. Some of the metal microparticle mask may remain at the time of terminating the etching. Further, when some of the metal microparticle mask remain, it is possible to eliminate the mask by processing it with acid such as aqua regia or nitric acid.

Roughening may be performed after forming the positive electrode having openings, or the positive electrode having openings may be formed after roughening regions corresponding to the openings in advance. When roughening is performed after forming the positive electrode, the positive electrode itself may be utilized as a protective mask at the time of etching. A thickness of the positive electrode in that case must be a thickness capable of being sufficiently resistant to dry etching. For example, when ITO is used as a positive electrode material, a thickness thereof is preferably greater than or equal to the half a depth to be etched.

As a substrate for the gallium nitride-based compound semiconductor light-emitting device of the present invention, substrate materials such as oxide single crystal such as sapphire single crystal ($Al_2O_3$; A-plane, C-plane, M-plane, R-plane), spinel type single crystal ($MgAl_2O_4$), ZnO single crystal, $LiAlO_2$ single crystal, $LiGaO_2$ single crystal and MgO single crystal, Si single crystal, SiC single crystal, GaAs single crystal, AlN single crystal, GaN single crystal, and boride single crystal such as $ZrB_2$ single crystal, are commonly known. In the present invention, any of substrate materials including these commonly-known substrate materials may be used without any restriction. Among those, sapphire single crystal and SiC single crystal are preferable. Further, there is particularly no limit to the plane direction of the substrate. The substrate may be on-axis without an off-angle or may be provided with an off-angle.

On the substrate, usually, an n-type semiconductor layer, a light-emitting layer, and a p-type semiconductor layer, which are formed of gallium nitride-based compound semiconductors, are stacked via a buffer layer. In some cases, a buffer layer is not required depending on a substrate to be used or growth conditions of an epitaxial layer.

As gallium nitride-based compound semiconductors, for example, gallium nitride-based compound semiconductors represented by the formula $Al_XGa_YIn_ZN_{1-A}M_A$ ($0 \leq X \leq 1$, $0 \leq Y \leq 1$, $0 \leq Z \leq 1$, and $X+Y+Z=1$, where the symbol M denotes a group-V element different from nitrogen (N), and $0 \leq A < 1$) are known in large numbers. In the present invention, gallium nitride-based compound semiconductors represented by the formula $Al_XGa_YIn_ZN_{1-A}M_A$ ($0 \leq X \leq 1$, $0 \leq Y \leq 1$, $0 \leq Z \leq 1$, and $X+Y+Z=1$, where the symbol M denotes a group-V element different from nitrogen (N), and $0 \leq A < 1$) including those commonly-known gallium nitride-based compound semiconductors may be used without any restriction.

The gallium nitride-based compound semiconductors may contain other group-III elements other than Al, Ga, and In, and may contain elements such as Ge, Si, Mg, Ca, Zn, Be, P, As and B as needed. Moreover, in some cases, the gallium nitride-based compound semiconductor may contain, not only elements which are added consciously, but also impurities necessarily contained depending on film formation condition and the like, and minute impurities contained in raw materials and reactive pipe materials.

A growth method of the gallium nitride-based compound semiconductors is not particularly limited, and all the methods for growing gallium nitride-based compound semiconductors, such as an MOCVD (Metal-Organic Chemical Vapor Deposition), an HVPE (Hydride Vapor Phase Epitaxial method), and an MBE (Molecular Beam Epitaxy method) may be applied to the invention. A preferable growth method is an MOCVD method from the standpoint of film thickness controllability and mass productivity. In an MOCVD method, hydrogen ($H_2$) or nitrogen ($N_2$) as a carrier gas, trimethyl gallium (TMG) or triethyl gallium (TEG) as a Ga source, trimethyl aluminum (TMA) or triethyl aluminum (TEA) as an Al source and trimethyl indium (TMI) or triethyl indium (TEI) as an In source, which are a group-III raw material, and ammonia ($NH_3$), hydrazine ($N_2H_4$), or the like as an N source which is a group-V raw material may be used. Further, as a dopant, silane ($SiH_4$) or disilane ($Si_2H_6$) as a Si raw material, and germanium gas ($GeH_4$) or an organic germanium Compound of tetramethyl germanium (($CH_3)_4Ge$), tetraethyl germanium ($(C_2H_5)_4Ge$), and the like as a Ge raw material may be utilized. In an MBE method, elemental germanium may be utilized as a doping source. With respect to a p-type semiconductor, for example, bis-cyclopentadienyl magnesium ($Cp_2Mg$) or bis-ethylcyclopentadienyl magnesium (($EtCp)_2Mg$) is used as an Mg raw material.

The n-type semiconductor layer is usually composed of an underlying layer, an n-type contact layer, and an n-type clad layer. The n-type contact layer is capable of serving as an underlying layer and/or an n-type clad layer. The underlying layer is preferably composed of an $Al_XGa_{1-X}N$ layer ($0 \leq X \leq 1$, preferably $0 \leq X \leq 0.5$, and more preferably $0 \leq X \leq 0.1$). A film thickness thereof is greater than or equal to 0.1 µm, and is preferably greater than or equal to 0.5 µm, and is more preferably greater than or equal to 1 µm. Provided that a film thickness is made greater than or equal to this film thickness, it is possible to easily obtain an $Al_XGa_{1-X}N$ layer having a satisfactory crystallinity.

An n-type impurity may be doped in the underlying layer within a range from $1 \times 10^{17}$ to $1 \times 10^{19}$ per $cm^3$. However, undoping ($<1 \times 10^{17}$ per $cm^3$) is more preferable from the standpoint of maintenance of satisfactory crystallinity. There is particularly no limit to an n-type impurity. However, for example, Si, Ge, and Sn, or the like may be exemplified, and Si and Ge are preferable.

A growth temperature at the time of performing the growth of the underlying layer is preferably 800 to 1200° C., and is more preferably controlled within a range from 1000 to 1200° C. Provided that the growth of underlying layer is performed within the range of growth temperatures, it is possible to obtain a underlying layer having a satisfactory crystallinity. Further, the pressure in the furnace for MOCVD growth is adjusted to be 15 to 40 kPa.

In the same way as the underlying layer, an n-type contact layer is preferably composed of an $Al_XGa_{1-X}N$ layer ($0 \leq X \leq 1$, preferably $0 \leq X \leq 0.5$, and more preferably $0 \leq X \leq 0.1$). An n-type impurity is preferably doped in the n-type contact layer, and when the n-type impurity is contained at a concentration of $1 \times 10^{17}$ to $1 \times 10^{19}$ per $cm^3$, and preferably of $1 \times 10^{18}$ to $1 \times 10^{19}$ per $cm^3$, it is preferable from the standpoint of maintenance of satisfactory ohmic contact with the negative electrode, the prevention of crack generation, and maintenance of satisfactory crystallinity. There is particularly no limit to an n-type impurity. However, for example, Si, Ge, and Sn, or the like may be exemplified, and Si and Ge are preferable. A growth temperature thereof is the same as that of the underlying layer.

The gallium nitride-based compound semiconductors forming the underlying layer and the n-type contact layer are preferably the same in composition, and a total film thickness of those is preferably set within a range from 1 to 20 µm, preferably from 2 to 15 µm, and more preferably from 3 to 12 µm. When a film thickness is within this range, the crystallinity of the semiconductor is maintained satisfactory.

It is preferable to provide an n-type clad layer between the n-type contact layer and the light-emitting layer. This is because it is possible to infill flatness deterioration caused on the uppermost surface of the n-type contact layer. The n-type clad layer may be formed of AlGaN, GaN, GaInN, or the like. Those may be formed as a hetero junction of these structures or a superlattice structure in which these structures are stacked several times. In a case of GaInN, it goes without saying that it is preferable to have a band gap greater than that of GaInN in the light-emitting layer.

A film thickness of the n-type clad layer is not particularly limited, and is preferably from 0.005 to 0.5 µm and more preferably from 0.005 to 0.1 µm. The n-type doping concentration of the n-type clad layer is preferably from $1\times10^{17}$ to $1\times10^{20}$ per cm$^3$, and more preferably from $1\times10^{18}$ to $1\times10^{19}$ per cm$^3$. When the doping concentration is within this range, it is preferable from the standpoint of maintenance of satisfactory crystallinity and the reduction in operating voltage for the device.

The light-emitting layer to be stacked on the n-type semiconductor layer is usually a light-emitting layer made of a gallium nitride-based compound semiconductor, and preferably of a gallium nitride-based compound semiconductor formed of $Ga_{1-s}In_sN$ (0<s<0.4) in the present invention. A film thickness of the light-emitting layer is not particularly limited. However, a film thickness to an extent that it is possible to obtain a quantum effect, i.e., a critical film thickness may be exemplified, which is preferably from 1 to 10 nm for example, and more preferably from 2 to 6 nm. When a film thickness is within the above-described range, it is preferable from the standpoint of emission output.

Further, the light-emitting layer may be made to have, not only a single quantum well (SQW) structure as described above, but also a multiquantum well (MQW) structure made of the $Ga_{1-s}In_sN$ as a well layer and an $Al_cGa_{1-c}N$ (0≦c<0.3 and b>c) barrier layer whose band gap energy is greater than that of the well layer. Further, an impurity may be doped in the well layer and the barrier layer.

As a growth temperature for the $Al_cGa_{1-c}N$ barrier layer, a temperature greater than or equal to 700° C. is preferable, and it is more preferable that, when the growth is performed at 900 to 1100° C., the crystallinity is made satisfactory. The growth of the GaInN well layer is performed at 600 to 900° C., and preferably at 700 to 900° C. Namely, in order to satisfactory make the crystallinity of the MQW, it is preferable to switch growth temperatures between the layers.

The p-type semiconductor layer is usually composed of a p-type clad layer and a p-type contact layer. However, the p-type contact layer may serve as a p-type clad layer. There is particularly no limit to a p-type clad layer if it has a composition in which its band gap energy is greater than that of the light-emitting layer, and is capable of performing carrier containment into the light-emitting layer. However, a p-type clad layer formed of $Al_dGa_{1-d}N$ (0<d≦0.4, preferably 0.1≦d≦0.3) may be preferably exemplified. When the p-type clad layer is formed of such AlGaN, it is preferable from the standpoint of carrier containment into the light-emitting layer. A film thickness of the p-type clad layer is not particularly limited, and is preferably 1 to 400 nm, and is more preferably 5 to 100 nm. The p-type doping concentration of the p-type clad layer is preferably from $1\times10^{18}$ to $1\times10^{21}$ per cm$^3$, and more preferably from $1\times10^{19}$ to $1\times10^{20}$ per cm$^3$. When the p-type doping concentration is within the above-described range, it is possible to obtain a satisfactory p-type crystal without deteriorating the crystallinity.

As a p-type contact layer, a gallium nitride-based compound semiconductor layer containing at least $Al_eGa_{1-e}N$ (0≦e<0.5, preferably 0≦e≦0.2, and more preferably 0≦e≦0.1) is used. When the Al composition is within the above-described range, it is preferable from the standpoint of maintenance of a satisfactory crystallinity and a satisfactory ohmic contact with a p ohmic electrode. When a p-type dopant at a concentration of $1\times10^{18}$ to $1\times10^{21}$ per cm$^3$, preferably of $5\times10^{19}$ to $5\times10^{20}$ per cm$^3$ is contained, it is preferable from the standpoint of maintenance of satisfactory ohmic contact, prevention of crack generation, and maintenance of a satisfactory crystallinity. The p-type impurity is not particularly limited. However, for example, Mg is preferably exemplified. A film thickness thereof is not particularly limited. However, it is preferably from 0.01 to 0.5 µm, and more preferably from 0.05 to 0.2 µm. When a film thickness is within the range, it is preferable from the standpoint of emission output.

The n-type contact layer is exposed by a means in common use, which is well-known in this technological field, and a negative electrode is provided to the exposed n-type contact layer. As a negative electrode, various structures using various materials are known, and any of materials and structures including these commonly-known negative electrodes may be used without any restriction. Further, as a manufacturing method, a well-known manufacturing method such as a vacuum evaporation method and a sputtering technique may be used without any restriction.

A mode of a light-emitting device is usually used as a so-called face up (FU) type in which emission of light is extracted from the positive electrode side on which the openings are provided.

The gallium nitride-based compound semiconductor light-emitting device of the present invention may be made into a lamp by providing a transparent cover by a means commonly known in this industry. Further, a white lamp may be manufactured by combining the gallium nitride-based compound semiconductor light-emitting device of the present invention and a cover having fluorescence substance.

Further, because a lamp manufactured from the gallium nitride-based compound semiconductor light-emitting device of the present invention has an excellent light extraction efficiency and a high emission output, it is possible for electronic equipments such as mobile telephones, displays, panels, and the like into which lamps manufactured by the technology are mounted, and machinery and equipment such as automobiles, computers, game machines, and the like into which these electronic equipments are mounted, to be driven by low electric power, which makes it possible to realize high characteristics. Especially, in devices driven by batteries such as mobile telephones, game machines, automobile parts, and the like, power saving can be achieved.

EXAMPLES

The present invention will be described in detail below by way of Example and Comparative Example, but the present invention is not limited only to this Example.

Example

Figure 8:
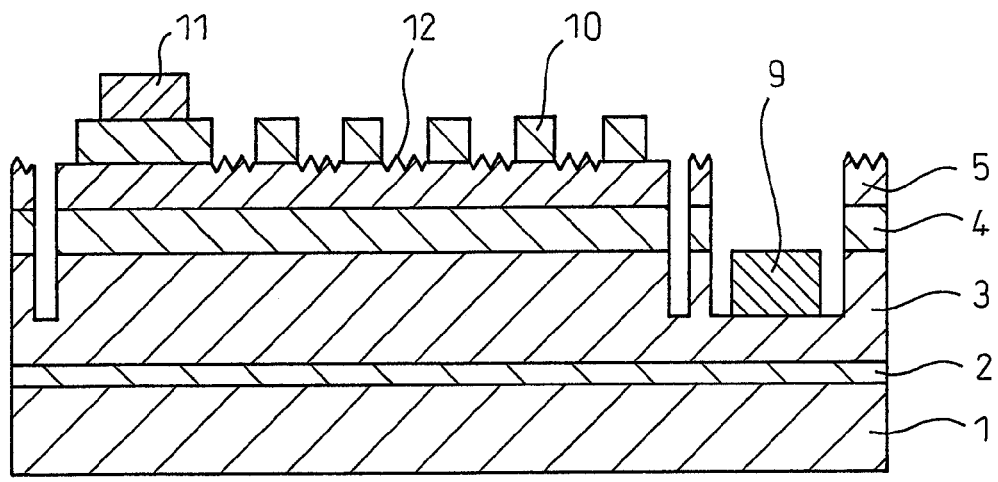
FIG. 8 is a diagram schematically showing a cross section of the gallium nitride-based compound semiconductor light-emitting device of the present invention manufactured in Example 1.
Figure 9:
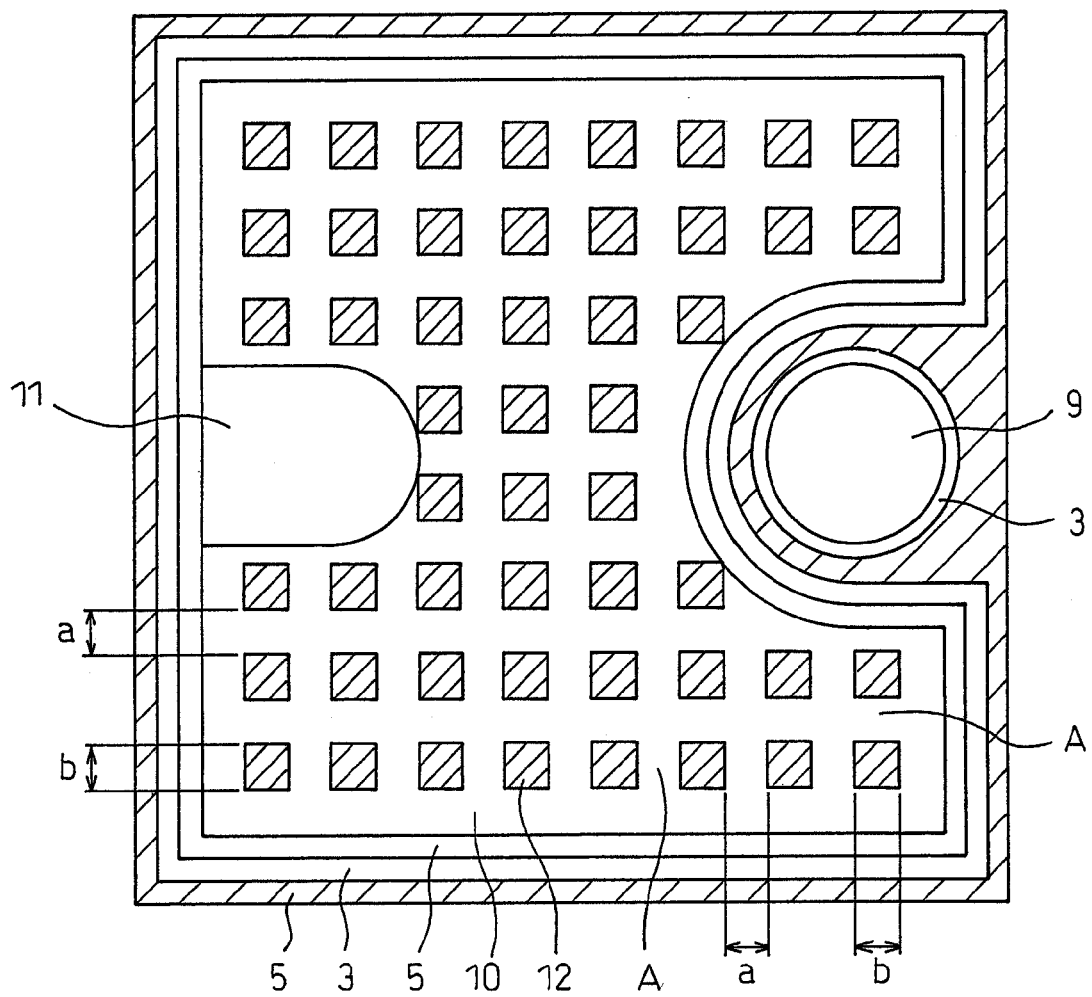
FIG. 9 is a diagram schematically showing a plane surface of the gallium nitride-based compound semiconductor light-emitting device of the present invention manufactured in Example 1.

A schematic cross sectional view of the gallium nitride-based compound semiconductor light-emitting device manufactured according to the example is shown in FIG. 8. Further, a schematic plan view thereof is shown in FIG. 9.

A stacked structure of the gallium nitride-based compound semiconductor has been structured such that an n-type semiconductor layer 3 composed of an underlying layer formed of an undoped GaN layer (layer thickness=8 μm), an n-type contact layer formed of an Si doped n-type GaN layer (layer thickness=2 μm, carrier concentration $1 \times 10^{19}$ cm$^3$) and an n-type clad layer formed of an Si doped n-type Al$_{0.07}$Ga$_{0.93}$N layer (layer thickness=25 nm, carrier concentration=$1 \times 10^{18}$ cm$^{-3}$), a light-emitting layer 4 having a multiquantum well structure in which a six-layered Si doped GaN barrier layer (layer thickness=14.0 nm, carrier concentration=$1 \times 10^{18}$ cm$^{-3}$) and a five-layered undoped In$_{0.20}$Ga$_{0.80}$N well layer (layer thickness=2.5 nm) are alternately stacked on one another, and a p-type semiconductor layer composed of a p-type clad layer formed of an Mg doped p-type Al$_{0.07}$Ga$_{0.93}$N layer (layer thickness=10 nm) and a p-type contact layer formed of an Mg doped Al$_{0.02}$Ga$_{0.98}$N layer (layer thickness=150 nm) are sequentially stacked via a buffer layer 2 formed of AlN on a substrate 1 made of a c-plane of sapphire ((0001) crystal plane). The growth of the respective structural layers of the above-described stacked structure has been performed by a general decompression MOCVD means.

In particular, the growth of the p-type contact layer formed of an Mg doped AlGaN layer has been performed according to the following procedure.

(1) After completion of the growth of the p-type clad layer formed of an Mg doped p-type Al$_{0.07}$Ga$_{0.93}$N layer, the pressure inside the growth reacting furnace has been set to $2 \times 10^4$ Pascal (Pa). As a carrier gas, hydrogen has been used.

(2) The vapor phase epitaxy of an Mg doped AlGaN layer has been started at 1020° C. with bis-cyclopentamagnesium serving as a Mg doping source by using trimethyl gallium, trimethyl aluminum, and ammonia as raw materials.

(3) The trimethyl gallium, trimethyl aluminum, and ammonia, and the bis-cyclopentamagnesium have been supplied into the growth reacting furnace continuously for four minutes, to perform the growth of an Mg doped Al$_{0.02}$Ga$_{0.98}$N layer so as to have a layer thickness of 0.15 μm.

(4) The supply of the trimethyl gallium, the trimethyl aluminum, and the bis-cyclopentamagnesium into the growth reacting furnace has been stopped, to stop the growth of the Mg doped Al$_{0.02}$Ga$_{0.98}$N layer.

Immediately after completion of the vapor phase epitaxy of the contact layer formed of the Mg doped AlGaN layer, hydrogen is switched to nitrogen as a carrier gas, and a flow rate of the ammonia is reduced, and a flow rate of the nitrogen serving as a carrier gas is increased by that reduced rate. In detail, the ammonia accounting 50% by volume of the total supply gas volume in the growth has been decreased to 0.2%. At the same time, the power distribution to a high-frequency induction heating system heater which has been utilized for heating the substrate has been stopped.

Moreover, after the stacked structure has been held for two minutes in this state, the distribution of the ammonia is stopped. At that time, the temperature of the substrate has been at 850° C.

After the layer has been cooled down to a room temperature in this state, the stacked structure has been taken out of the growth reacting furnace, and the atomic concentrations of magnesium and hydrogen in the p-type contact layer formed of the Mg doped AlGaN layer have been quantified by a general SIMS spectrometry. The magnesium atoms have been distributed in a concentration of $7 \times 10^{19}$ cm$^{-3}$, and in a concentration substantially constant from the surface to the depth direction. On the other hand, the hydrogen atoms have existed at substantially a constant concentration of $6 \times 10^{19}$ cm$^{-3}$. Further, the resistivity has been estimated as appropriately 150 Ωcm due to measurement by a general TLM method.

An LED has been manufactured by using the above-described stacked structure.

First, the lattice pattern positive electrode 10 formed of ITO whose thickness is 450 nm has been formed on only regions on the p-type AlGaN contact layer at which the electrode is to be formed by using a photolithography technology and a liftoff technique which are commonly known. A vacuum evaporation system conventionally used has been used for forming the positive electrode 10. Thereafter, in order to increase the transparency of the ITO metal film, a thermal treatment has been performed in the oxygen atmosphere. A width (a in FIG. 9) of a bar (A in FIG. 9) of the lattice pattern electrode has been set to 5 μm. Further, a distance (b in FIG. 9) between the respective bars has been set to 20 μm.

Next, roughening for roughened regions has been carried out. The roughened regions are portions shaded in FIG. 9., which are the openings 12 of the lattice pattern positive electrode, the four sides of the light-emitting device, and between the negative electrode and the positive electrode. First, patterning onto the roughened regions has been executed by using a resist, to apply a resist film onto the regions other than the roughened regions. Thereafter, AuSn has been deposited to be a thickness of 150 Å at a pressure less than or equal to $3 \times 10^{-3}$ torr by using a general vacuum evaporation system. After the deposition, the AuSn thin film on the resist film has been separated and eliminated along with the resist film by a general method, to selectively form thin films of AuSn on the roughened regions.

Next, a thermal treatment has been carried out at 250° C. in the anoxic atmosphere, to agglutinate the AuSn thin film so as to be granulated, which has formed a mask formed of metal microparticles. The diameters of the metal microparticles have ranged from 0.2 to 0.5 μl, and the density thereof has been $2 \times 10^6$ pieces/mm$^2$.

Next, in the exposed semiconductor layer, a semiconductor layer other than the regions, at which the n-type contact layer will be exposed, including regions at which the negative electrode 5 will be formed, has been protected by the resist film, and the semiconductor layer has been exposed at only the regions at which the n-type contact layer will be exposed. Thereafter, general dry etching has been performed thereto.

In this dry etching, because the mask formed of metal microparticles has been formed on the roughened regions, the roughened regions have been selectively etched in a pattern according to the pattern of the metal microparticles by the dry etching, which has made it possible to perform roughening onto the p-type semiconductor layer into a pattern with curved surfaces. Further, because the semiconductor layer other than the portions covered with the mask formed of metal microparticles and the resist film have been normally etched by dry etching, after the dry etching, the n-type contact layer has been exposed. Accordingly, by this dry etching, the regions at which the n-type contact layer has been exposed, the regions at which roughening has been formed on the surface of the p-type semiconductor layer, and the regions at which the surface of the p-type semiconductor layer has remained are respectively formed simultaneously. In this dry etching, the lattice pattern positive electrode 10 serves as a protective film.

FIG. 5 is a SEM photograph (at a magnification of 15,000 times) of the surface of the roughened regions. From this drawing, the diameters of the spherical particulates 30 existing in the roughened regions have ranged from 0.1 to 0.5 µm, and the density thereof has been approximately $2\times10^6$ pieces/mm$^2$. Further, FIG. 6 is a SEM photograph (at a magnification of 20,000 times) of a cross section of the roughened regions after resin-packaging which will be described later. From this drawing, the heights of the protruding portions 31 forming the roughened surface of the roughened regions have been from 0.3 to 0.6 µm, and the diameters of the maximum portions thereof have been from 0.1 to 0.5 µm.

Next, in order to form the positive electrode bonding pad 11 on the transparent positive electrode 10 formed of ITO, after Cr layer has been formed to be a thickness of 40 nm as an adhesive layer, Ti layer has been formed to be a thickness of 100 nm, and Au layer has been formed to be a thickness of 1000 nm as the top layer, which has formed the positive electrode bonding pad 11.

Next, the negative electrode 5 has been formed on a negative electrode forming region on the exposed n-type contact layer according to the following procedure.

After a resist has been uniformly applied onto the entire surface, the resist has been eliminated from the negative electrode forming portion on the exposed n-type contact layer by using a well-known lithography technology, and the negative electrode formed of Ti having a thickness of 100 nm and Au having a thickness of 200 nm in this order from the semiconductor side has been formed by a vacuum evaporation method usually used. Thereafter, the resist has been eliminated together with the negative electrode formed thereon by a well-known method.

After the negative electrode and the positive electrode have been formed, the rear surface of the sapphire substrate 1 has been polished by using abrasive grains of diamond microparticles, to be finally finished as a mirror surface. Thereafter, the stacked structure has been cut out so as to be separated as a square individual LED with side-lengths 350 µm. Next, the individually divided LED has been mounted in a can package, and an emission output and a forward voltage thereof have been measured by a tester. As a result, the emission output and the forward voltage by an impressed current of 20 mA have indicated 11 mW and 3.7 V.

In observation of the light-emitting plane, the openings 12 of the lattice pattern positive electrode have emitted light from the entire surface. Further, the roughened regions at the four sides of the light-emitting device and between the negative electrode and the positive electrode have emitted light. It is considered that the light-emitting area has been enlarged due to the roughening, which has improved the emission output.

Further, the light-emitting device manufacture in the present example, and the light-emitting device in which the roughened regions are substantially composed of flat planes have been packaged with a resin generally used for LED lamps, and the outputs before and after the packaging have been confirmed. As a result, the light extraction effect coefficients by using the resin have been 1.30 times in the former case, and 1.15 times in the latter case. In the present invention, the improvement effect on output has been confirmed, which may be improved due to the penetration of the resin.

Comparative Example

A gallium nitride-based compound semiconductor light-emitting device has been manufactured in the same way as in the example 1 except for the point that roughening is not performed, and the gallium nitride-based compound semiconductor light-emitting device has been evaluated. A forward voltage and an emission output of the light-emitting device have been respectively 3.5 V and 8 mV.

INDUSTRIAL APPLICABILITY

The gallium nitride-based compound semiconductor light-emitting device including the positive electrode having the openings provided by the present invention emits light from the entire surface of the openings and the light extraction efficiency is improved, a high emission output is indicated. Accordingly, the gallium nitride-based compound semiconductor light-emitting device is extremely useful industrially.

The invention claimed is:

1. A gallium nitride-based compound semiconductor light-emitting device comprising a substrate; an n-type semiconductor layer, a light-emitting layer, and a p-type semiconductor layer, the layers being formed of a gallium nitride-based compound semiconductor and being stacked in this order on the substrate; a positive electrode which is provided so as to contact the p-type semiconductor layer; and a negative electrode which is provided so as to contact the n-type semiconductor layer, wherein the positive electrode is a positive electrode having openings, and at least a portion of the surface of the p-type semiconductor layer corresponding to the openings are roughened surfaces whose apical portions are semi-spherical,
wherein a density of protruding portions (particulates) of the roughened surface is from $1\times10^5$ pieces/mm$^2$ to $1\times10^8$ pieces/mm$^2$.

2. The gallium nitride-based compound semiconductor light-emitting device according to claim 1, wherein the positive electrode having the openings is in a lattice pattern or a comb-like pattern.

3. The gallium nitride-based compound semiconductor light-emitting device according to claim 2, wherein widths of bars of the lattice pattern or teeth of the comb-like pattern are from 1 pm to 50 pm.

4. The gallium nitride-based compound semiconductor light-emitting device according to claim 2, wherein a distance between bars of the lattice pattern or teeth of the comb-like pattern is from 1 pm to 50 gm.

5. The gallium nitride-based compound semiconductor light-emitting device according to claim 1, wherein diameters of protruding portions (particulates) of the roughened surface are from 0.01 to 3 µm.

6. The gallium nitride-based compound semiconductor light-emitting device according to claim 1, wherein heights of upper ends of the roughened surface are from 0.1 to 2 µm from a surface at which the negative electrode is formed.

7. The gallium nitride-based compound semiconductor light-emitting device according to claim 6, wherein the heights of upper ends of the roughened surface are the same height as the surface of the p-type semiconductor layer.

8. The gallium nitride-based compound semiconductor light-emitting device according to claim 1, wherein heights of the protruding portions of the roughened surface are from 0.01 to 1 µm.

9. A lamp comprising the gallium nitride-based compound semiconductor light-emitting device according to claim 1.

10. The gallium nitride-based compound semiconductor light-emitting device according to claim 1, wherein the roughened surface also exists at four sides of the light-emitting device.

11. The gallium nitride-based compound semiconductor light-emitting device according to claim 1, wherein the roughened surface also exists between the positive electrode and the negative electrode.

12. A method for manufacturing a gallium nitride-based compound semiconductor light-emitting device, comprising the following steps (1) to (4) of:

(1) stacking an n-type semiconductor layer, a light-emitting layer, and a p-type semiconductor layer which are formed of a gallium nitride-based compound semiconductor, in this order on a substrate;

(2) forming a positive electrode having openings on the p-type semiconductor layer;

(3) forming a mask formed of metal microparticles on the p-type semiconductor layer corresponding to the openings; and (4) performing dry etching onto the gallium nitride-based compound semiconductor from above the mask so that at least a portion of the surface of the p-type semiconductor layer corresponding to the openings are roughened surfaces whose apical portions are semispherical, wherein a density of protruding portions (particulates) of the roughened surface is from $1\times10^5$ pieces/mm$^2$ to $1\times10^8$ pieces/mm$^2$.

13. The method according to claim 12, wherein the step (3) comprises the step of forming a metal thin film on the p-type semiconductor layer and the step of a thermal treatment thereafter.

14. The method according to claim 12, wherein the metal microparticles are made of metal selected from the group consisting of Ni, Au, Sn, and Ge, or a low melting point alloy containing at least one kind of these metals.

15. A gallium nitride-based compound semiconductor light-emitting device manufactured by the method according to claim 12.

16. An electronic equipment incorporating the lamp according to claim 9.

17. A mechanical device incorporating the electronic equipment according to claim 16.

\* \* \* \* \*